United States Patent [19]
Fitzpatrick et al.

[11] Patent Number: 4,912,745
[45] Date of Patent: * Mar. 27, 1990

[54] LOGIC CIRCUIT CONNECTING INPUT AND OUTPUT SIGNAL LINES

[75] Inventors: Mark E. Fitzpatrick, San Jose; Andrew C. Graham, Sunnyvale, both of Calif.

[73] Assignee: Gazelle Microcircuits, Inc., Santa Clara, Calif.

[*] Notice: The portion of the term of this patent subsequent to Dec. 13, 2005 has been disclaimed.

[21] Appl. No.: 278,876

[22] Filed: Dec. 2, 1988

Related U.S. Application Data

[63] Continuation of Ser. No. 51,984, May 19, 1987.

[51] Int. Cl.$^4$ ........................................... H03K 19/094
[52] U.S. Cl. .................................... 307/448; 307/443; 307/450
[58] Field of Search ............... 307/446, 448, 450, 473, 307/475, 572, 574, 581, 443

[56] References Cited

U.S. PATENT DOCUMENTS

| | | | |
|---|---|---|---|
| 4,394,589 | 7/1983 | Pham et al. | 307/446 X |
| 4,410,815 | 10/1983 | Ransom et al. | 307/448 X |
| 4,450,369 | 5/1984 | Schuermeyer | 307/450 |
| 4,491,747 | 1/1985 | Shimizu | 307/446 |
| 4,514,649 | 4/1985 | Nuzillat et al. | 307/446 X |
| 4,575,821 | 3/1986 | Eden et al. | 307/446 X |
| 4,663,543 | 10/1987 | Sitch | 307/448 X |
| 4,698,524 | 10/1987 | Plagens | 307/446 X |
| 4,698,527 | 10/1987 | Matsumoto | 307/475 |
| 4,701,643 | 10/1987 | Laude et al. | 307/450 |
| 4,701,646 | 10/1987 | Richardson | 307/570 |
| 4,712,023 | 12/1987 | Otsuki et al. | 307/448 X |
| 4,791,322 | 12/1988 | Graham et al. | 307/475 |

FOREIGN PATENT DOCUMENTS 0042777 12/1981 European Pat. Off. ............ 307/450

*Primary Examiner*—David Hudspeth
*Attorney, Agent, or Firm*—Skjerven, Morrill, MacPherson, Franklin & Friel

[57] ABSTRACT

This invention discloses a logic circuit including first, second and third transistors with the control terminals of two of those transistors being connected to the input signal lead, with the output signal lead being connected to one of the current handling terminals of one of those transistors, and with a load device connected to the respective current handling terminals of those two transistors and one of the voltage supply terminals.

3 Claims, 9 Drawing Sheets

LOGIC CIRCUIT CONNECTING INPUT AND OUTPUT SIGNAL LINES

This application is a continuation of application Ser. No. 051,984, filed 5/19/87.

BACKGROUND OF THE INVENTION

1. Field of the Invention

This invention relates to electronic systems, and more particularly, to electronic systems which are with advantage implemented in compound semiconductor technology, such as gallium arsenide technology.

2. Description of the Prior Art

The advantage of the high speed of operation of a circuit implemented in compound semiconductor technology (for example gallium arsenide technology), as compared to silicon technology, is well known. In the continuing effort to increase operating speed of integrated circuits and the systems incorporating them, various approaches have been tried in such technology with relatively limited levels of success and/or serious limitations on usability.

Heretofore, the main thrust has been to attempt to provide circuits implemented in gallium arsenide which are to be operatively coupled with other circuits implemented in that technology. That is, there has until now been no serious effort toward providing circuits implemented in "fast" gallium arsenide technology which can be operatively coupled with "slow" silicon-based integrated circuits, such as TTL, CMOS (including advanced CMOS technology), NMOS, Schottky and low powered Schottky (including advanced Schottky technology), all of which will be referred to as "standard logic" herein.

In the event that gallium arsenide-based integrated circuits could be coupled with such standard logic circuits, this would enable one to gain speed in a system based on standard logic by replacing a standard logic silicon-based part with a gallium arsenide based part. In doing so, appropriate input buffer circuits and output buffer circuits, implemented in gallium arsenide technology and coupled in the same package with gallium arsenide based internal logic and/or memory, would be of great advantage. Such input and output buffer circuits would allow one to use standard device packaging, standard testing procedures and equipment, standard input/output levels from and to the standard logic devices operatively connected with the gallium arsenide based integrated circuit, and standard power supplies.

Typical prior art approaches to input buffers for implementation in gallium arsenide technology using MESFETS are shown in FIGS. 1 and 2. However, both such prior art circuits include numerous disadvantages.

For example, referring to FIG. 1, two separate external power supplies are needed ($V_{cc}$, positive, and $V_{ss}$, negative). These supplies must sink significant current if the buffer is to attain reasonably high speed. Because of this, it is very difficult to use an on-chip charge pump to generate a negative supply for such a chip that has a significant number of inputs, without a large waste in die area and power. This results in a distinct disadvantage for a customer using standard logic since a negative supply must be externally added to the system.

Both the circuits of FIGS. 1 and 2 use a source follower input device (transistors 20, 20a) whose drain is tied to the positive voltage supply $V_{cc}$ (for example +5 volts). Because of this, the gate to drain diode of transistor 20 or 20a clamps the input to a diode drop level above the voltage level $V_{cc}$ and an input signal that was raised more than a diode drop level above the $V_{cc}$ level would begin sinking large currents into he voltage source $V_{cc}$. Standard logic families do not exhibit this characteristic and a system that does exhibit this characteristic could well be perceived as undesirable. Furthermore, the transistor 20 or 20a could well be damaged if excessive current were passed through its gate, which could well happen in a realistic system application under a variety of conditions. The net result could be chip failure, perhaps in the field, which results in a tremendous disadvantage to both the chip user and the system user, due to the cost of locating and repairing the failure as well as loss of credibility concerning device reliability.

The approach of FIG. 1 further compounds the problems recited in the preceding paragraph, due to the input path to ground created by the transistor 20's gate-source diode, the diodes 22, 24, 26, and transistor 28's gate-source diode. This condition is in general less desirable than that described in the preceding paragraph since five diodes above ground (approximately 4 volts) is in general lower than one diode above voltage source $V_{cc}$ (approximately 5.8 volts). This makes the reliability problems mentioned above more likely to occur in any general system and leads to problems when the input signal is expected to interface with CMOS style outputs which attempt to pull up to voltage level $V_{cc}$.

The approach of FIG. 2 results in an input signal threshold which is strongly dependent on negative power supply voltage $V_{ss}$. As a result, $V_{ss}$ must be tightly regulated to avoid input signal threshold variations. Since most traditional implementations of standard logic do not have input signal thresholds strongly dependent on any supply voltage, this could be perceived as a significant disadvantage to a user.

The input signal clamping effects of the two prior art circuits make it difficult to offer high ESD specifications for these input signals since they tend to draw high current at low voltage. It is difficult to create a protection device for the input signal that will turn on before the path from input terminal to $V_{cc}$ or ground turns on and does damage under a static discharge condition.

These input signal clamping effects also make it difficult or impossible to use high voltage logic on the device pins. Since the use of high voltage logic requires that input signals be capable of being raised to levels well above supply voltage $V_{cc}$ and ground (approximately 10–12 volts above ground) to access special test features or even customer used features, such clamping effects prevent the prior art circuits from being used in these sorts of applications.

In regard to an output buffer circuit for use in the environment described and implementable with advantage in gallium arsenide technology, a general discussion first follows.

Output buffer circuits which may be used to implement three-state functionality are well known in the prior art. The symbol for an active low three-state buffer is shown in FIG. 3. Referring thereto, active low three-state buffer 30 receives a low enable input signal $\overline{E}$ at enable-disable terminal 32, and a data input signal J at input terminal 34. In response to the data and enable signals, buffer 30 provides an output signal Z at output terminal 36. When the active low three-state output buffer is disabled by application of a high enable signal $\overline{E}$ (i.e. logical 1), the output terminal 36 is in a high impedance state, and is effectively disconnected from both ground and positive voltage supply $V_{cc}$ connected to buffer 30. Conversely, when 8 buffer 30 is enabled by a low enable signal $\overline{E}$ (i.e. logical 0), the output signal Z at terminal 36 is determined by the data input signal J applied to the terminal 34. Thus, with buffer 30 enabled, and a logical 0 data input signal J applied to buffer 30, buffer 30 will provide a logical 0 output signal Z. Conversely, with buffer 30 enabled and a logical 1 input signal J applied to buffer 30, buffer 30 will provide a logical 1 output signal Z.

The active high three-state output buffer operates in a similar manner, except that it is enabled by a high enable signal E, and disabled by a low enable signal E.

Various prior art approaches for implementing CMOS/TTL compatible output buffer circuits are shown in FIGS. 4–6. While each of these circuits is capable of implementation in gallium arsenide technology, no means are provided in any of these approaches to generate a standard three-state condition, as described above. As the advantages of three-state devices are well known, his is a severe disadvantage.

Furthermore, each of these approaches requires two separate external power supplies in addition to ground, one supplying a positive voltage and another supplying a negative voltage. As pointed out above, the inclusion of such a negative supply voltage is a distinct disadvantage for a user of standard logic. In addition, in these approaches, similar to the description of prior art input buffers, a significant current must be sourced into the negative supply in order to achieve high speed. This precludes the use of an on-chip charge pump to generate the negative supply internally without a large waste of power and die area.

In regard to the circuits shown in FIGS. 4 and 5, these circuits use depletion mode pullup devices connected directly to the output. The output lead sinks current to the positive voltage supply if the output signal is pulled up slightly above the level of the voltage supply. This is not characteristic of standard logic devices.

As the circuits of FIGS. 4 and 5 use depletion mode pullup devices, these devices must have current through them while the output signal is in the low state. Since these devices must be large if the output signal i to meet the standard logic output current specifications, such current in the low state will be large and will result in an unacceptable waste of power.

In addition, in the prior art circuits of FIGS. 4 and 6, these circuits require input signal levels which are below ground, further aggravating the problem mentioned above in regard to additional negative voltage supply.

In regard to the prior art logic gate/buffer circuits of FIGS. 7–11, each of these circuits includes significant drawbacks in design and functioning thereof.

In the circuit shown in FIG. 7 two voltage supplies are required, with significant current flowing into the second supply $V_{ss}$. Furthermore, such a circuit requires high power for high speed operation.

In regard to the circuit of FIG. 8, such a circuit overcomes the problem of the need for two power supplies, but this circuit has a very poor noise margin, low fan out capability, and is very intolerant of processing, supply voltage, and temperature variations.

Regarding the circuit of FIG. 9, such circuit has a higher fan out capability than the circuit of FIG. 8, but also has a very poor noise margin and is also very intolerant of variations in processing, supply voltage, and temperature.

The circuit of FIG. 10 again has the disadvantage of requiring two voltage supplies, and further involves large signal swings due to the use of depletion mode devices. Furthermore, the capacitor of that circuit must be large enough to drive the on-chip capacitive load, which results in a larger die area than desired.

As shown in the FIG. 11, this circuit requires only a single voltage supply, but has the problem that the output pullup device never quite turns off, and the output pulldown device is a depletion device which comes out of saturation sooner than desired and reduces current available to pull the output signal low, and furthermore conducts more current than desired when the output signal is high for a given low current. SUMMARY In accordance with the teachings of this invention, the present logic circuit has an input signal lead for receiving an input signal, an output signal lead for providing an output signal, a first voltage supply terminal, and a second voltage supply terminal. The logic circuit includes first, second and third transistors. The first transistor has a first current handling terminal, a control terminal, and a second current handling terminal. Load means are connected between the first voltage supply terminal and the first current handling terminal of the first transistor. The second transistor has a first current handling terminal connected to the first voltage supply terminal, a control terminal connected to the first current handling terminal of the first transistor, and a second currently handling terminal. The third transistor has a first currently handling terminal connected to the second current handling terminal of the second transistor, a control terminal, and a second current handling terminal. The control terminals of the first and third transistors are connected to the input signal lead, and the output signal lead is connected to the first current handling terminal of the third transistor. A load device is connected between the respective second current handling terminals of the first and third transistors and the second voltage supply terminal.

DESCRIPTION OF THE PREFERRED EMBODIMENTS

Figure 1:
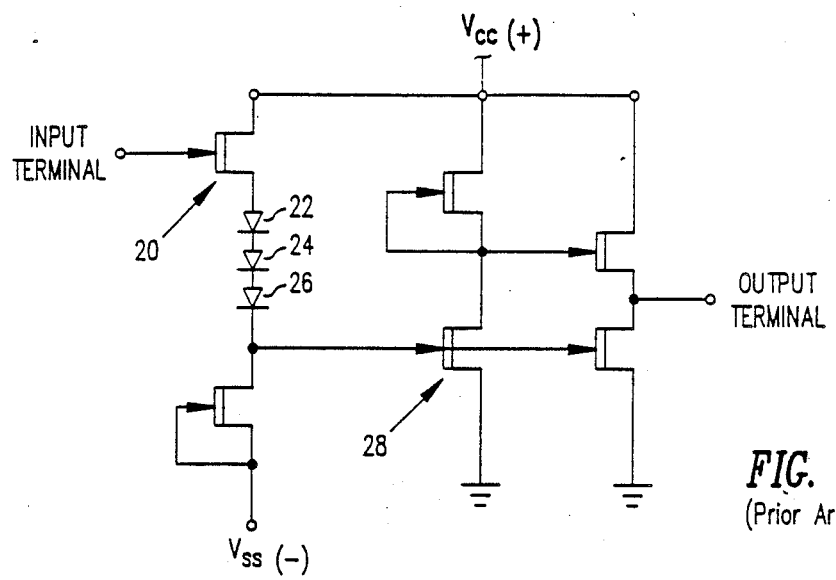
FIGS. 1–11 are schematic views of prior art circuits as described above.
Figure 2:
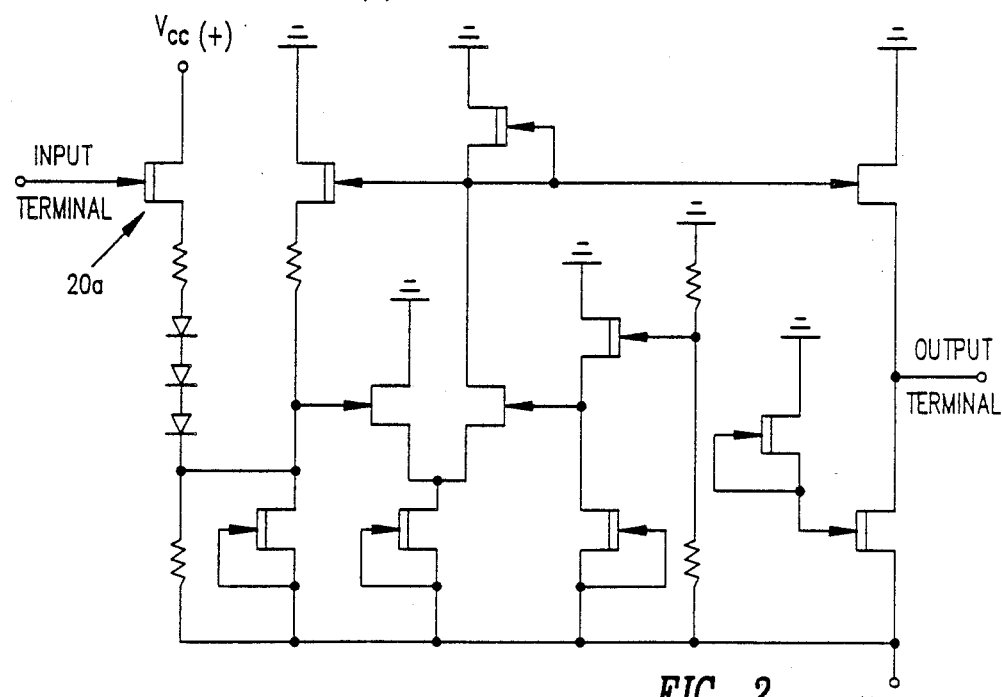
Figure 3:
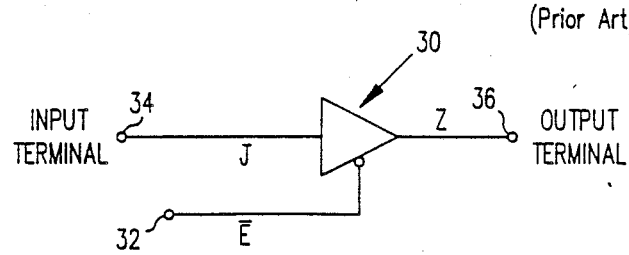
Figure 4:
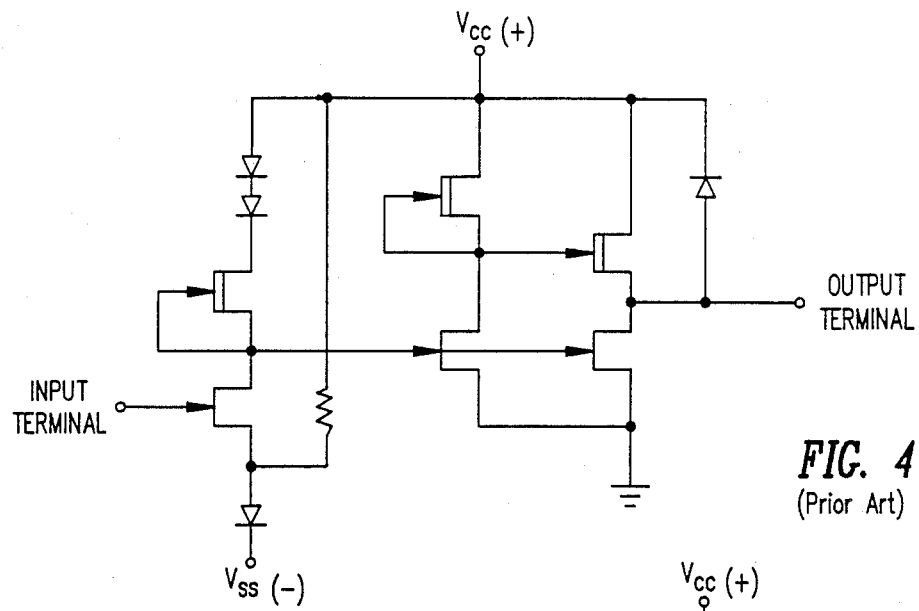
Figure 5:
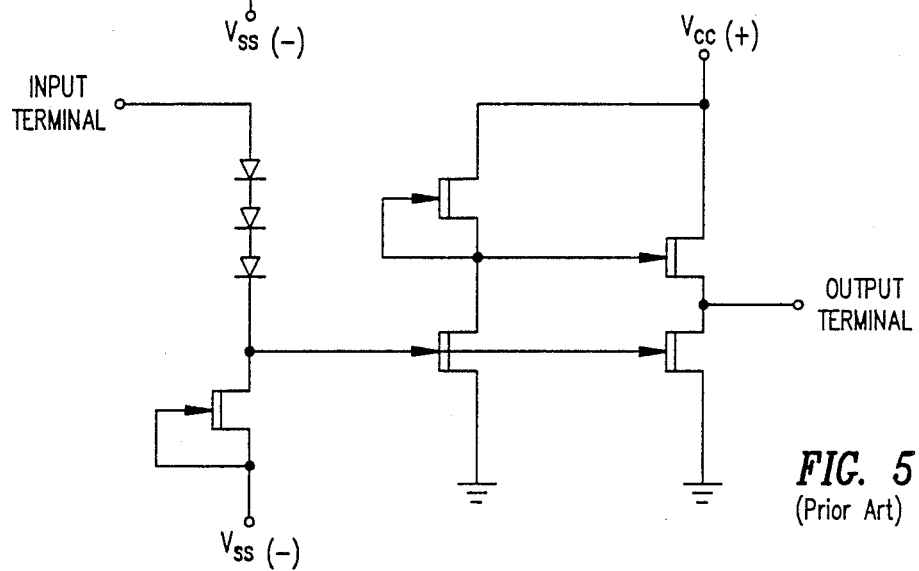
Figure 6:
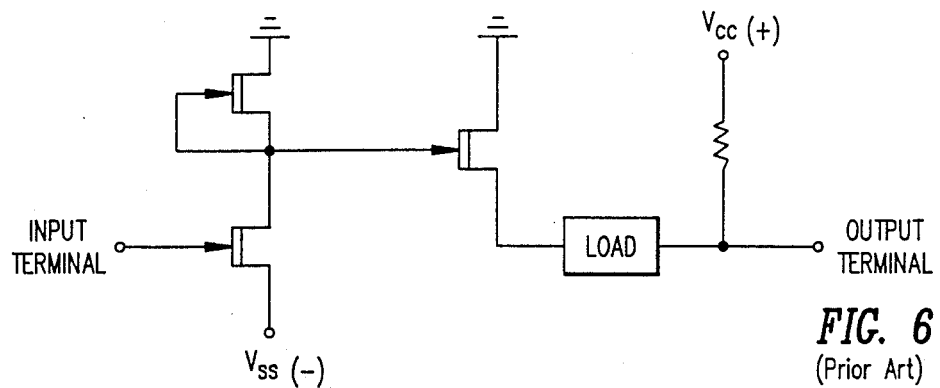
Figure 7:
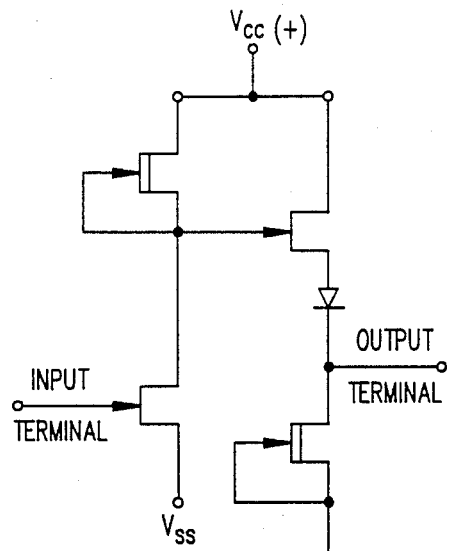
Figure 8:
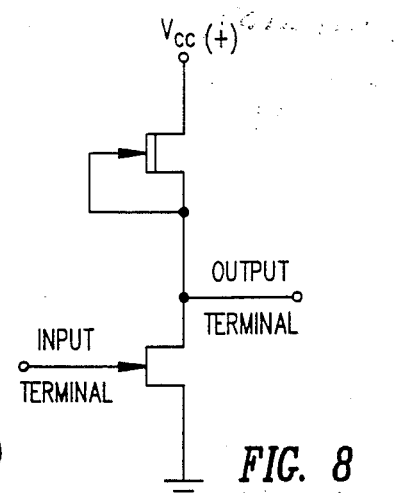
Figure 9:
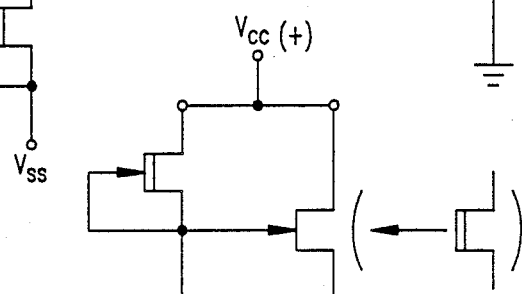
Figure 10:
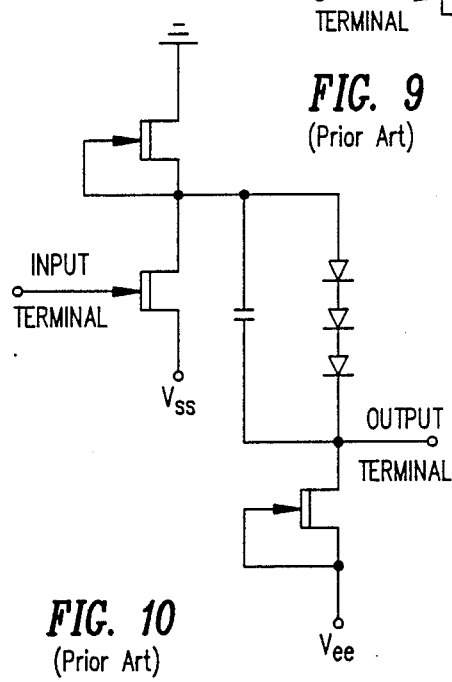
Figure 11:
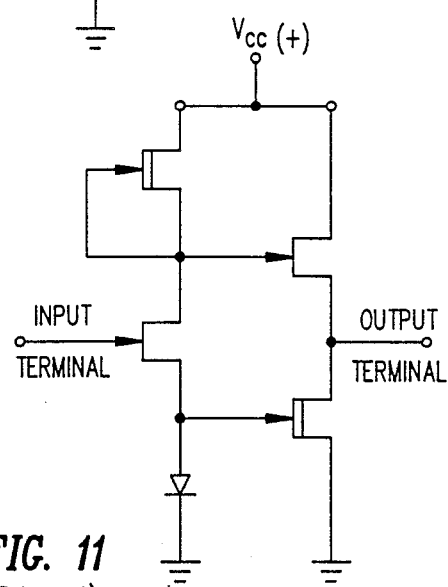
Figure 12:
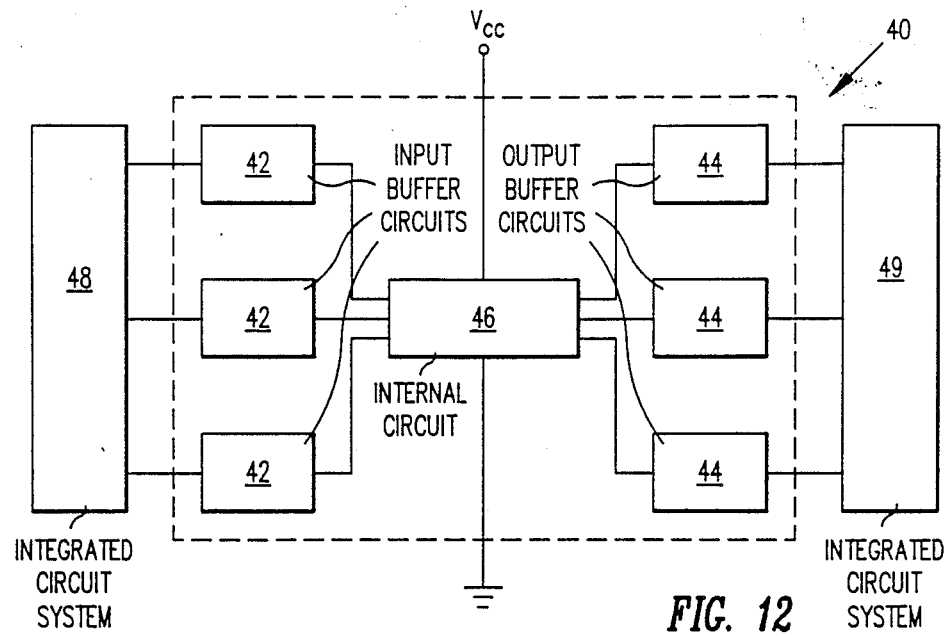
FIG. 12 is a general functional view of circuitry employing one or more of the present inventions.

Shown in FIG. 12 is an overall system 40 which incorporates one or more of the various inventions herein. The system 40 includes one or more input buffer circuits 42, one or more output buffer circuits 44, and an internal logic and/or memory circuit 46, all of which are implemented in gallium arsenide technology and all of which are operatively connected. These circuits are each connected to a positive voltage supply $V_{cc}$ and to ground. The input buffer circuit communicates with an integrated circuit system 48 which uses standard logic, an the output buffer circuit also communicates with an integrated circuit system 49 also using standard logic.

The internal logic and/or memory circuit 46 may take a wide variety of forms, as long as it is compatible with signals from the input buffer circuits 42, and as long as the output signals therefrom are compatible with the output buffer circuits 44.

The input buffer circuit 2 will now be described in detail.

Figure 13:
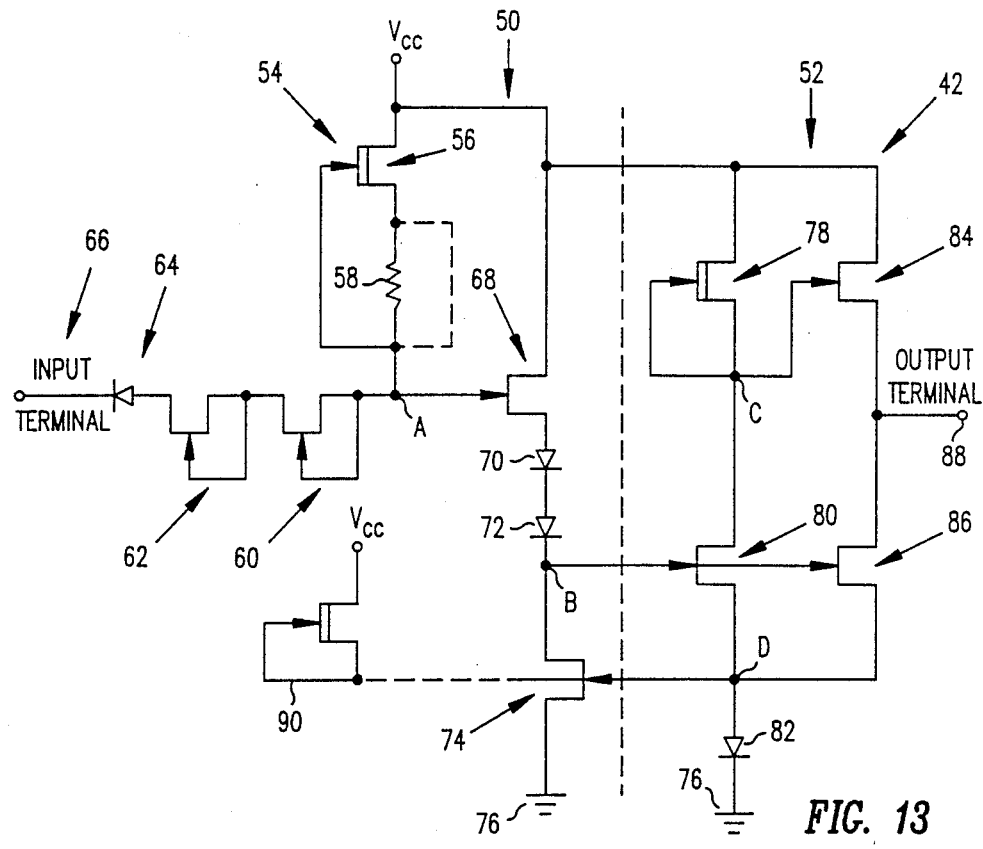
FIG. 13 is a schematic view of the present input buffer circuit.
Figure 14:
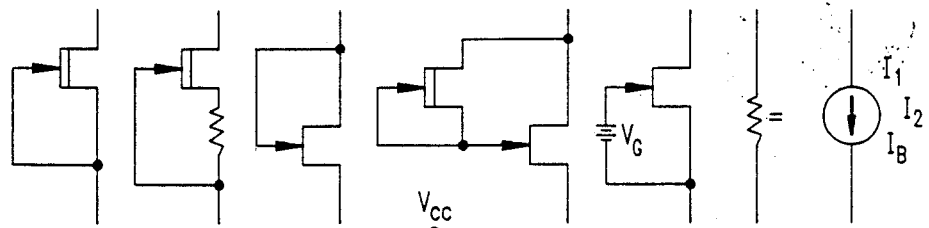
FIG. 14 is a series of load devices which may be used in the present circuits.

Referring to FIG. 13, the input buffer circuit 42 includes an input signal level shifter stage 50 and a buffer stage 52. As part of the input signal level shifter stage, a positive voltage supply $V_{cc}$, in this case +5 volts, connects to a load device 54 which may take the form of any of those shown in FIG. 14, which is a partial list of usable load devices. In this case, the load device 54 takes the configuration of an N-channel depletion type field effect transistor 56 having its drain connected to a voltage supply terminal 57 which connects to positive voltage supply $V_{cc}$, and its gate connected to its source, through a resistor 58 if desired (in the case of each field effect transistor one source/drain region may for purposes of terminology be considered a first current-handling terminal, the other source/drain region may be considered a second current-handling terminal, and the gate may be considered a control terminal). The source of the transistor 56 is connected to load devices 60, 62 and diode 64 in series, the diode 64 being connected to the input terminal 66, and being reverse biased in the direction of the input signal to the buffer circuit 42. The source of the transistor 56 is also connected to the gate of N-channel enhancement type field effect transistor 68. The drain of that transistor 68 is also connected to the voltage supply terminal 57, while the source thereof is connected through two diodes 70, 72 to the drain of another N-channel enhancement type field effect transistor 74, the source of which is connected to a second voltage supply terminal 76, which is a ground voltage supply terminal.

The diodes 70, 72 are forward biased in the direction from the first voltage supply terminal 57 to the second voltage supply terminal 76

The buffer stage 52 of the circuit 42 includes another load device 78 connected to the voltage supply terminal 57, and an N-channel enhancement type field effect transistor 80 having its drain connected to the load device 78 and its source connected to terminal 76 through a diode 82 forward biased in the direction from terminal 57 to terminal 76.

Another N-channel enhancement type field effect transistor 84 has its drain connected to the voltage supply terminal 57 and its source connected to the drain of another N-channel enhancement type field effect transistor 86. This transistor 86 has its drain connected to the source of transistor 84 and its source connected to both the gate of transistor 74 and the source of transistor 80, and the drain of transistor 74 is connected to the gates of both transistors 80, 86. The output terminal 88 is connected between the source and drain of respective transistors 84, 86.

The load devices 60, 62 provide voltage drops from the voltage supply terminal to the diode 64, which itself provides a further standard diode voltage drop (approximately 0.7 volts). With the input signal at terminal 66 low, this determines a certain voltage level (low) at node A. When the input signal is taken high, the voltage drops described above result in node A being taken to a higher voltage level than previous (logic level high). Thus, the input signal level shifter 50 shifts the voltage level applied to the gate of the transistor 68, but is directly responsive to the input signal at terminal 66, providing a logic level high input signal at the gate of the transistor 68 in response to an input signal level high, and a low input signal to the gate of transistor 68 in response to an input signal level low.

Assuming a high input signal level to the gate of transistor 68, this pulls the node B high, turning the transistors 80 and 86 on. This brings the node C low, which provides that the transistor 84 is off. The output terminal 88 communicates with ground terminal 76 through transistor 86 and diode 82. Thus, in this situation, the output signal from the circuit 42 is low.

Conversely, a low input signal to the transistor 68 from the input level shifter stage 50 reduces the current from transistor 68 allowing transistor 74 to pull node B toward ground and below the level of node D. This insures that transistors 80 and 86 turn off even for a wide variety of temperature and processing variations on their thresholds. Consequently, the signal at output terminal 88 will be pulled high by the action of transistors 78 and 84.

A load device in the form of a transistor may be included at 90 to act as an optional pullup for the pedestal diode 82 in order to keep it forward biased (which insures that transistor 74 always remains on and acts a load device)

It will be seen that the present circuit does not require a negative voltage supply, which eliminates the drawbacks mentioned above. The diode 64 is included to prevent current from flowing into the buffer circuit 42, either to ground terminal 76 or to terminal 57, except under breakdown conditions, which means that the circuit 42 can be designed to tolerate input voltages as high as 20 volts above ground (or voltages substantially below ground) without sinking large or damaging currents. Tis eliminates the problems in relation to the prior art described above. The present invention also generates an input buffer signal with an input threshold based on two diode drops (70, 72) as do many standard logic families. Because of this, the input threshold is not strongly dependent on any power supply voltage and can be made to stay within standard logic limits under standard logic supply variations (5 volts ±0.5 volts) which further eliminates problems described above.

The novel input level shifter stage 50 can be coupled to a variety of buffer stages to create an overall input buffer circuit configured as desired.

Note that diode 64 does not have to be a diode but can by any blocking device with a diode-like characteristic (reverse drop significantly higher than forward voltage drop)

Figure 15:
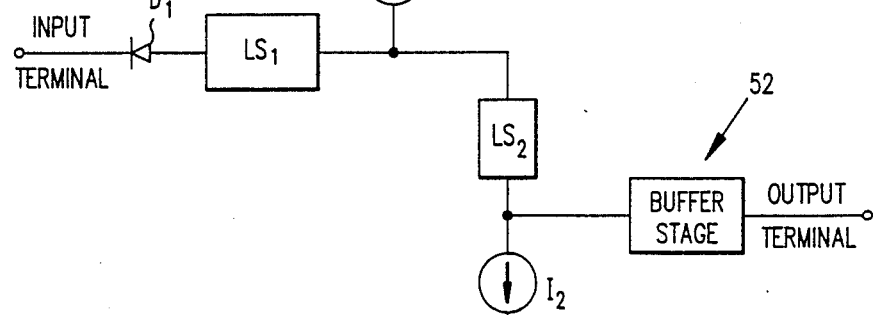
FIG. 15 is a functional view of the circuit of FIG. 13.

FIG. 15 illustrates a general implementation of the invention. The input signal level shifter stage consists in general of a blocking element D1, level shifters LS$_1$ and LS$_2$, sources of current I$_1$ and I$_2$, and a buffer stage 52 having an input threshold of V$_{Ib}$. The elements D$_1$, LS$_1$, I$_1$, LS$_2$, and I$_2$ are chosen so that V$_{Ib}$+V$_{LS2}$−V$_{LS1}$−$\phi$ (diode drop of diode D$_1$)=the desired input threshold level. In the preferred embodiment of FIG. 13, LS$_1$ consists of transistors 60, 62, LS$_2$ consists of transistor 68 and diodes 70, 72, I$_1$ consists of transistor 56 and resistor 58, and I$_2$ consists of transistor 74. The buffer stage 52 consists of diode 82, and transistors 78, 80, 84, 86.

Figure 16:
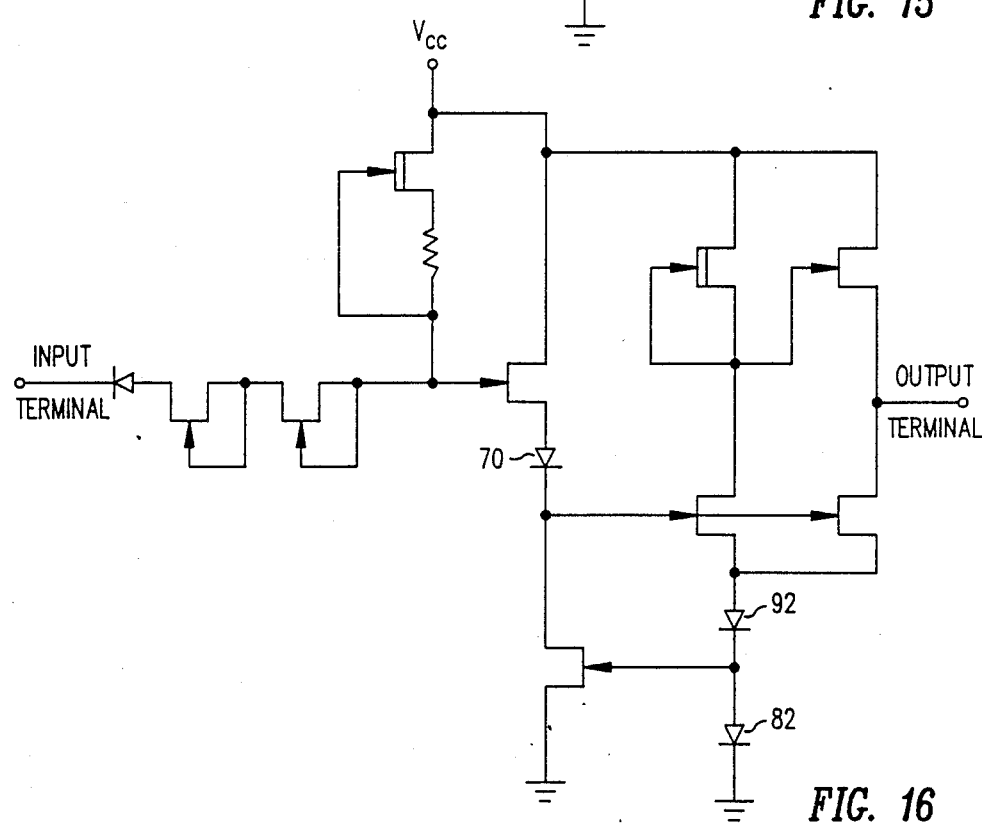
FIG. 16 shows a variation of the circuit of FIG. 13.

A wide variety of input buffers with a wide variety of input thresholds can be accommodated by adjusting LS$_1$ and LS$_2$. FIG. 16 demonstrates a perturbation of the buffer stage in this manner. The addition of diode 92 to the buffer stage causes its input threshold to be 2$\phi$ (diode drops of diodes 82, 92)+V$_{gs}$ instead of $\phi$ (diode drop diode 82)+V$_{gs}$. This is easily accommodated by eliminating diode 72 in the input level shifter stage 50 as described in FIG. 16.

Figure 17:
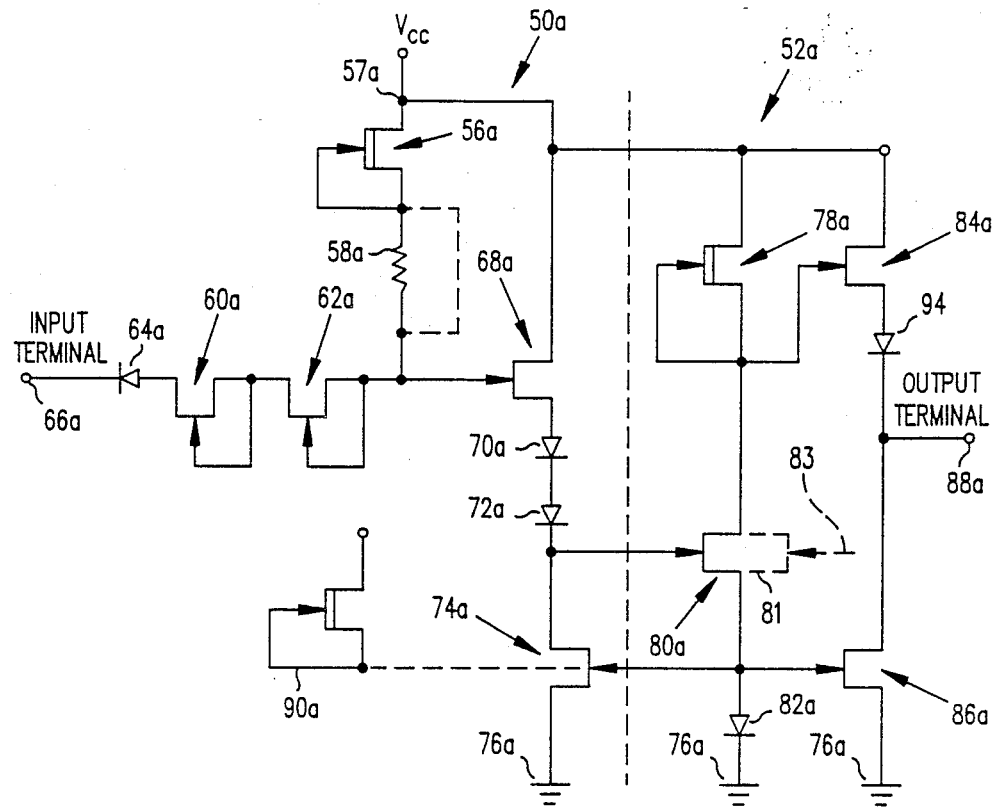
FIG. 17 shows yet another variation of the circuit of FIG. 13.

FIG. 17 shows a second preferred embodiment of the input buffer circuit using a modified FET logic buffer stage. This circuit includes an additional diode 94 between the source of transistor 84a and the drain of transistor 86a, the diode 94 being forward biased the direction from voltage supply terminal 57a to voltage supply terminal 76a. The output terminal 88a is connected between the diode 94 and the drain of transistor 86a.

In both FIGS. 13 and 17, the transistor 56, 56a in conjunction with optional resistor 58, 58a sets up a current that defined the current through diodes 64, 64a, transistor 60, 60a, and transistor 62, 62a when the input voltage is at, around, or below the threshold. Resistor 58, 58a can be used to keep this current within desirable limits if the process used does not allow depletion device 56, 56a to have a low enough current. Transistor 74, 74a is used to set up current through transistor 68, 68a, diode 70, 70a and diode 72, 72a. The currents this sets up are adjusted along with the geometry sizes of diodes 64, 64a transistor 60, 60a transistor 62, 62a transistor 68, 68a, diodes 70, 70a and diodes 71, 71a to produce the desired level shift voltage drops. Turning on transistor 74, 74a requires a gate voltage bias (in this case equal to one diode drop) which is provided by the pedestal diode 82, 82a in the buffer stage. The pedestal diode must be biased up by a current which can be provided by an optional pullup current source 90, 90a or can be the result of sharing the pedestal level among many stages of logic in such a way as to guarantee a constant minimum level of current into diode 82, 82a. The embodiment of FIG. 13 offers the advantage of high dynamic drive in both output directions. The embodiment of FIG. 17 offers output low levels with in a few tenths of a volt above ground without further level shifting due to transistor 86a acting as a load device to ground, and not as a switch transistor. The use of the transistor 68, 68a, in both embodiments, as a source follower with current gain allows high speed operation with reasonably low I$_{il}$ values even while using buffer stags having fairly high input capacitance values. An additional N-channel enhancement type field effect transistor 81 may be included as shown having its drain connected to the drain of transistor 80a, and its source connected to the source of transistor 80a, and another input signal lead 83 connected to its gate, so as to act as a NOR gate.

Figure 18:
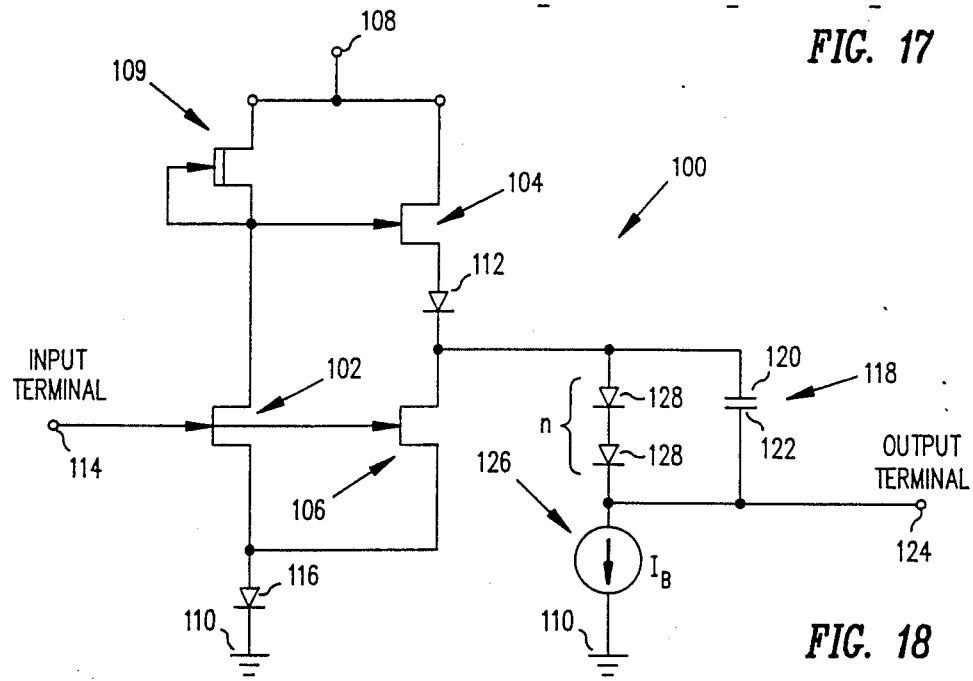
FIG. 18 is a schematic view of the present capacitor coupled pushpull circuit.
Figure 19:
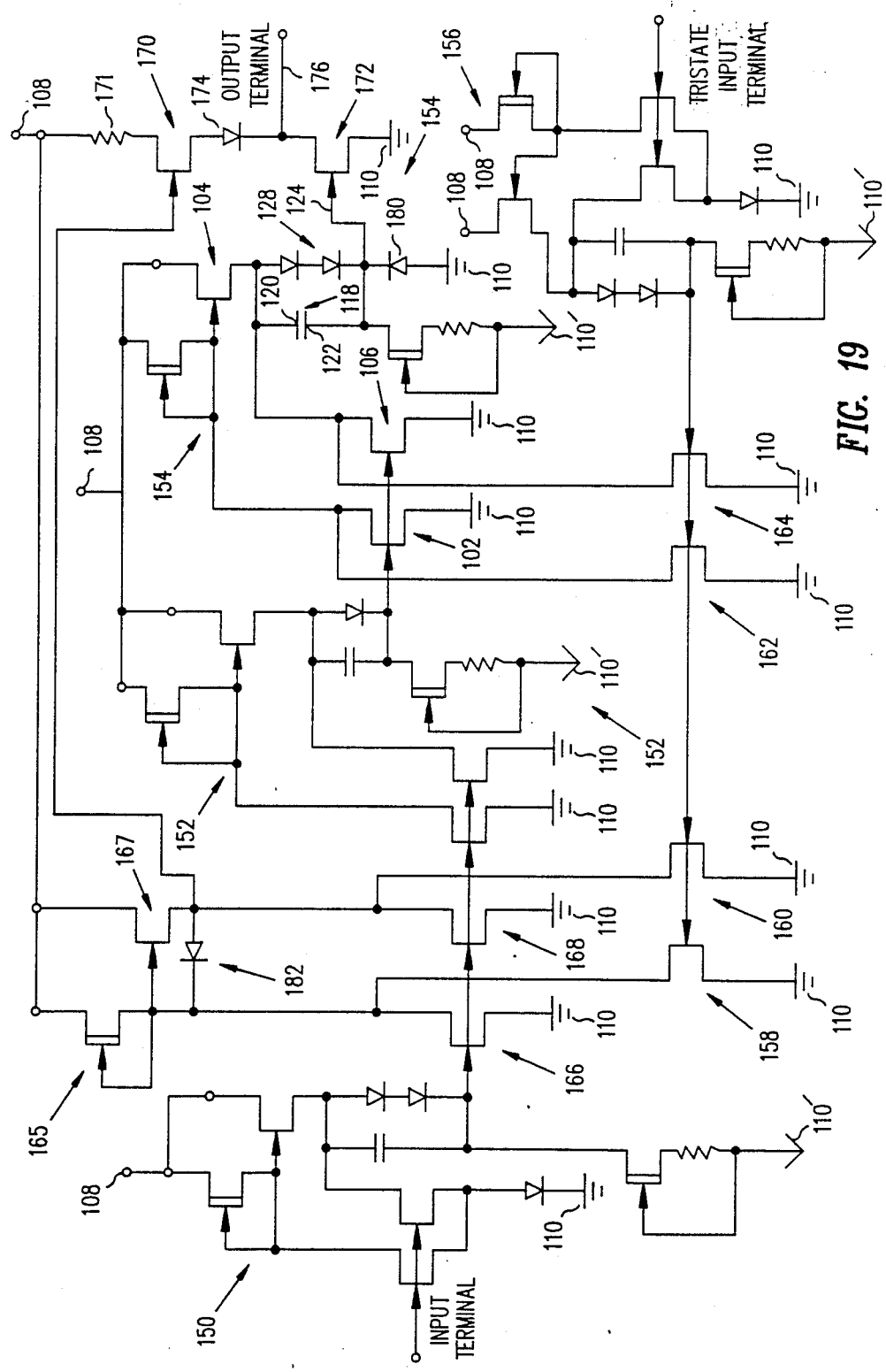
FIG. 19 is a schematic view of the present output buffer circuit.

Referring now to the output buffer circuit, shown in FIG. 18 is a buffer stage circuit 100 which makes up the basic building block of the circuit of FIG. 19.

As shown therein, the circuit 100 includes three N-channel enhancement mode field effect transistors 102, 104, 106. The transistor 102 has a drain connected to a voltage supply terminal 108 through load deice 109, a gate, and a source connected through a diode 116 to a second voltage supply terminal 110 in the form of a ground terminal. The transistor 104 has its drain connected to the first voltage supply terminal 108, a gate connected to the drain of the transistor 102, and a source. The transistor 106 has its drain connected to the source of the transistor 104 through a diode 112, the diode 112 being forward biased in the direction from the source voltage supply terminal 108 to the voltage of the supply terminal 110. The transistor 106 further has a gate, and a source connected to the source of transistor 102. The input signal terminal 114 is connected to the gates of both the transistors 102, 106. The sources of the transistors 102, 106 are connected to ground terminal 110 through a forward biased diode 116. A capacitor 118 is included, having a pair of terminals 120, 122, one terminal 120 connected to the drain of the transistor 106, and the other terminal 122 connected to the output terminal 124. The output terminal 124 is also connected through a load device 126 to a voltage supply terminal, which in this embodiment may also be ground terminal 110. This load device 126 is included as part of the connection between the ground terminal 110 and the output terminal 124, and may take any of the forms shown in FIG. 14. Connected in parallel with the capacitor 118 between the one terminal 120 of the capacitor 118 and the output terminal 124 are a plurality of diodes 128 forward biased in the direction from the voltage supply terminal 108 to the voltage supply terminal 110.

In the operation of the circuit of FIG. 18, the diodes 128 form a level shifter which can be adjusted for a variety of levels to suit different applications. That is, the number (including zero) of such diodes 128 may be chosen to suit different needs. With the input signal level high on terminal 114, the transistors 102, 106 turn on, turning transistor 104 off, forcing the output signal of the circuit low. The drain of the transistor 106 sinks current from the load through the capacitor 118. The transistor 106 can be made large to drive large loads without increasing power since transistor 104 shuts off and there is no DC current flow between the transistors 104, 006. The transistor 102 serves to pull the gate of transistor 104 to near ground thereby turning transistor 104 off. When the input signal level is low, the transistors 102, 106 shut off, allowing the load device 109 to pull the gate of transistor 104 high. This turns transistor 104 on which sources current to the lead terminal 124 through the capacitor 118 and the level shift diodes 128, which pulls the output signal of the circuit high.

The diode 116 is used to raise the input threshold of the circuit well above ground and eliminate the need for a negative supply on the preceding stage. Similarly, a negative supply is not required on the presently described stage if the following stage has a high enough input threshold (in which case load device 126 is connected to ground as shown instead of a positive or negative voltage supply).

The diode 112 is a power saving diode which can be used when the transistor 104 has a negative threshold voltage as in a depletion mode device. It serves to ensure that transistor 104 turns off in the output low signal state when the transistor 104 has a negative threshold voltage. The diode 112 can also be replaced by a series of diodes if the threshold voltage of the transistor 104 requires such, and when use of such a diode 112 is not necessary (in the case of the transistor 104 having a positive threshold voltage) it is replaced by a short circuit.

The present circuit shown in FIG. 19 uses three stages 150, 152, 154 of the type shown in FIG. 18 in series, and another stage 156 of that type which receives the three-state input signal, and additional circuitry interconnecting these stages which will now be described.

The output terminal of the three-state input signal stage 156 connects to the input terminal of gates of N-channel enhancement mode field effect transistors 158, 160, 162, 164, the source of each such transistor being connected to ground terminal 110. The output terminal of the stage 150 connects to the gates of N-channel enhancement mode field effect transistors 166, 168, the drains of which connect to the drains of transistors 158, 160, respectively. The drains of the transistor 102, 106 of stage 154 connect to the drains of the transistors 162, 164, respectively. A load device 165 in the form of an N-channel depletion mode transistor has its drain connected to the voltage supply terminal 108, and its gate and source connected to the drain of transistor 166. The drain of transistor 166 is further connected to the gate of a transistor 167. The drain of transistor 167 is connected to the voltage supply terminal 108, and its source is connected to the drain of transistor 168. A diode 182 is connected between the respective drains of transistor 168 and transistor 166 and forward biased in the direction from transistor 168 to transistor 166. The source of transistor 167 further is connected to the gate of an N-channel enhancement type field effect transistor 170, which has its drain connected through a resistor 171 to the voltage supply terminal 108 and its source connected to the drain of an N-channel enhancement type transistor 172. The input lead 173 connected to the gate of transistor 172 is connected to the terminal 122 of capacitor 118. That transistor 172 has its source connected to ground terminal 110 and its drain connected to the source of transistor 170 through a diode 174 forward biased in the direction from the voltage supply terminal 108 to the ground terminal 110. The output terminal 176 of the overall circuit is connected to the drain of transistor 172.

In the situation where the three-state input signal is high, that signal is inverted through the stage 156, so that a low signal is applied to the gates of the transistors 158, 160, 162, 164, holding them off. In such state, in the case where the input signal to stage 150 is high, the output signal from the stage 150 (low) is applied to the following stage 152, inverted thereby, applied (high) to the following stage 154 and inverted thereby, and applied (low) to the gate of the transistor 172 which turns transistor 172 off. Because transistors 158, 160 are off, the gate of transistor 170 connects to the voltage supply at terminal 108 turning transistor 170 on, so that voltage from the voltage supply terminal 108 is supplied to the output lead 176. Thus, the pair of transistor 170, 172 acts as an inverter, inverting the output signal from stage 154.

Likewise, with the input signal to stage 150 low, that signal travels through the stages 150, 152, 154, being supplied t the gate of transistor 172 as a high signal and turning transistor 172 on the transistor 170 off, because transistors 166, 168 are on connecting the gate of transistor 170 to ground. Again, the transistors 170, 172 act as an inverter for the signal taken from the stage 154.

In the event the third state is chosen, the three-state input signal is taken low, inverted by the stage 156, and applied high to the gates of transistors 158, 160, 162, 164 to turn them on, connecting the gate of the transistor 170 with ground, and the drains of the transistors 102, 106 with ground, insuring also that the transistor 172 is off. With both the transistors 170, 172 off, the output lead 176 of the overall circuit assumes a high impedance state consistent with the standard logic three-state condition. In this state, with both transistors 170, 172 off, no current is wasted there through. The diode 174 is present to ensure that the transistor 170 shuts off entirely even if the threshold voltage is somewhat negative, thus allowing for a wide process and temperature tolerance. The output signal of the stage 154 is designed to drive the gate of the transistor 172 one diode drop below ground to allow similar tolerance on the threshold voltage of the transistor 172. The state 154 is also designed with two diodes 128 in its level shifter to allow for a smaller capacitance of the capacitor 118 thereof to adequately drive the large gate capacitance of transistor 172.

The diode 180, reverse biased in the direction from the voltage supply terminal 118 to the ground voltage supply terminal 110, is used to prevent the gate of transistor 172 from going too low and slowing down the response of the output signal. The diode 182 is used to add extra pulldown drive to the gate of the transistor 170 to speed the response of the output signal. The stages 150, 156 are designed to accept high input threshold levels so the circuits generating their input signals do not need to use negative supply voltages. The diode 174, forward biased in the direction from voltage supply terminal 108 to the ground supply terminal 110, also allows the output signal to go well above the voltage supply level without sinking current while in the high states, even when the voltage threshold of transistor 170 is negative.

The stages 150, 152, 154, 156 are designed to source only a very small amount of current to the voltage supply terminals 110' connected respectively thereto so that an internal charge pump may be used to generate a second voltage supply (if needed) on the chip at terminals 110' in a practical fashion.

The flexibility of the stage design allows for such design to accept and generate a wide range of input and output signal levels which can be used to allow for large noise margins and create circuits that can tolerate wide process and temperature variations.

As can be seen, the use of two separate external power supplies can be avoided. In addition, the present circuit can be readily implemented in gallium arsenide technology.

The buffer circuits as disclosed are compatible with standard logic signal thereinto and therefrom, and may be part of an overall integrated circuit device which uses standard packaging, testing and power supplies traditionally used with standard logic circuits.

The above description of input and output buffer circuits each include a single positive external power supply, without the need for an additional, external negative power supply. The following description is made with reference to FIGS. 18 and 19, and involves an on-chip charge pump for generating a negative voltage in those situations where provision of such a negative supply may be considered desirable.

Figures 20, 22:
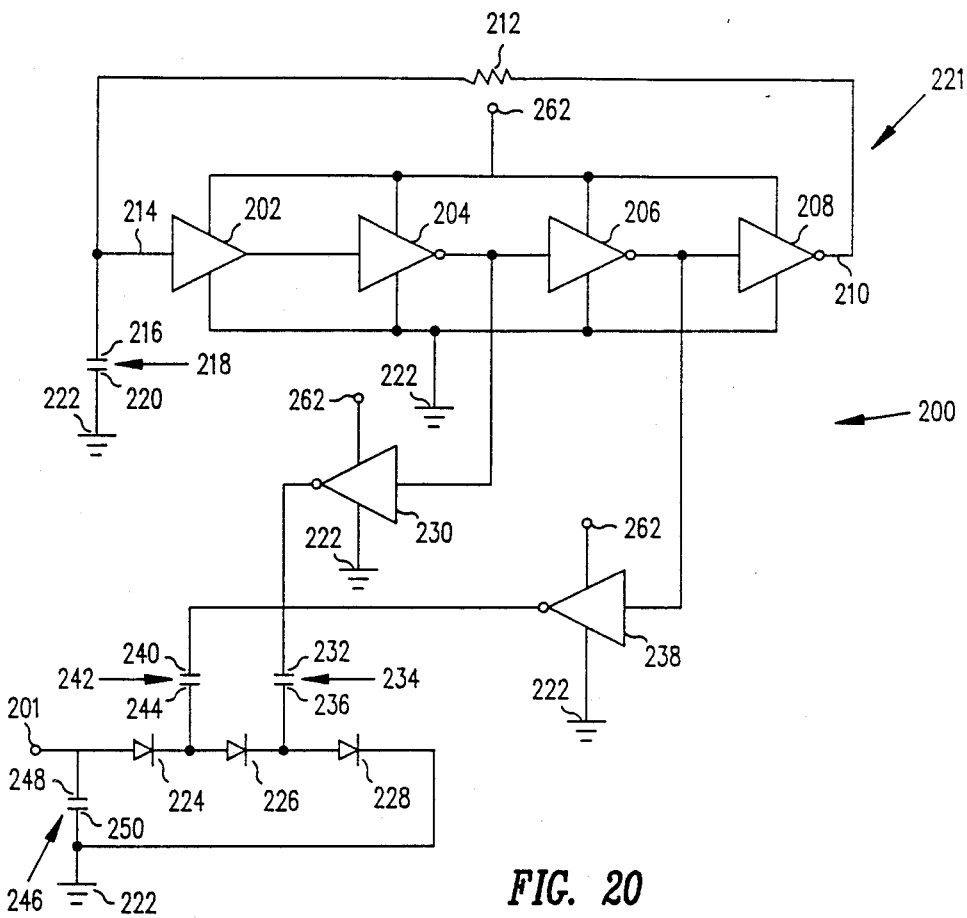
FIG. 20 is a functional view of the present oscillator circuit and Schmitt trigger circuit.
FIG. 22 is a drawing of wave forms of the Schmitt trigger circuit of FIGS. 20 and 21.

The general layout of the charge pump 200 is shown in FIG. 20. As shown therein, a Schmitt trigger 202 has its output terminal connected to the input terminal of an inverter 204, the output terminal of which is in turn connected to another inverter 206. The output terminal of that inverter 206 is in turn connected to the input terminal of another inverter 208, the output terminal 210 of which connects through a resistor 212 to the input terminal 214 of the Schmitt trigger 202. The input terminal 214 also has connected to it one terminal 216 of a capacitor 218, the other terminal 220 of which is connected to ground terminal 222. The portion of the circuit thus far described makes up the oscillator 221 of the circuit. Diodes 224, 226, 228 are connected in series, forward biased in the direction from terminal 201 to ground. A signal is taken from the output terminal of inverter 204, and provided through an inverter 230 to one terminal 232 of a capacitor 234. The other terminal 236 of the capacitor 234 is connected between the diodes 226, 228. The output signal of inverter 206 is provided through an inverter 238 to one terminal 240 of another capacitor 242, the other terminal 244 of which is connected between diodes 224, 226. The output of the charge pump is taken at terminal 201 from the diode 224, the opposite diode 228 being connected to ground terminal 222. A capacitor 246 has one terminal 248 connected to output terminal 201, and the other terminal 250 connected to ground terminal 222.

Figure 21:
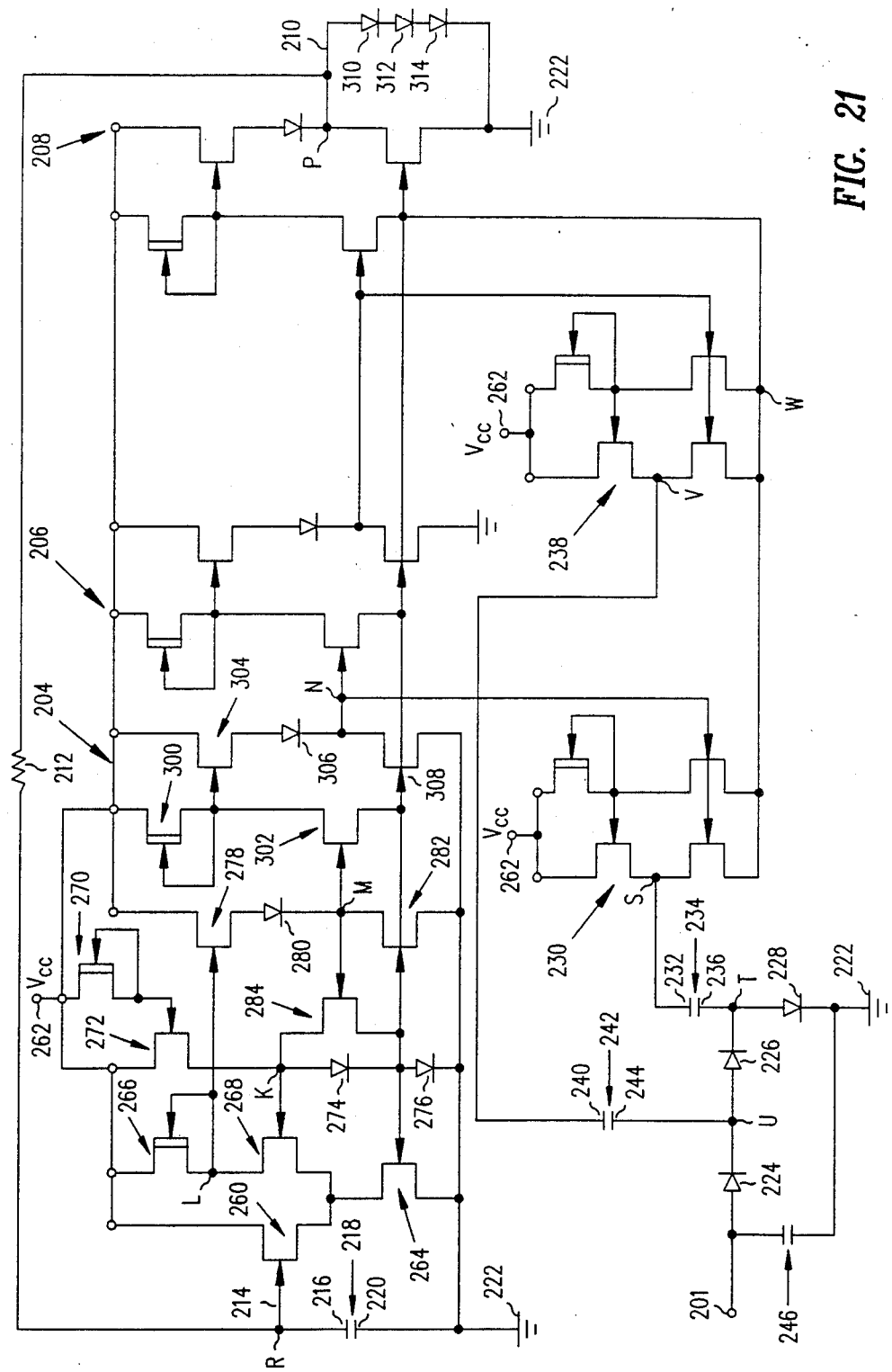
FIG. 21 is a schemtic view of the circuit of FIG. 20.

The Schmitt trigger 202 is shown in detail in FIG. 21. Such circuit includes an N-channel enhancement-type field effect transistor 260 having its drain connected to the voltage supply terminal 262, and its source connected to the drain of a load device in the form of another N-channel enhancement type field effect transistor 264, having its source in turn connected to ground terminal 222.

A load device 266 is connected to a voltage supply terminal 262, and the drain of another N-channel enhancement type field effect transistor 268 is connected to the load device 266, the source of the transistor 268 being tied to the source of the transistor 260. Another load device 270 is connected to the voltage supply terminal 262, and has its second terminal connected to the gate of an N-channel enhancement type field effect transistor 272. That transistor 272 has its drain connected to the voltage supply terminal 262 and its source connected to two diodes 274, 276 in series, forward biased in the direction from the voltage supply terminal 262 to ground terminal 222. Tee source of the transistor 272 connects to the gate of transistor 268. An N-channel enhancement-type field effect transistor 278 is included, having its drain connected to the voltage supply terminal 262 and its source connected o diode 280 forward biased in the direction from the terminal 262 to terminal 222. The drain of transistor 268 connects to the gate of transistor 278. A load device in the form of an N-channel enhancement type field effect transistor 282 is included, the diode 280 connecting the source of transistor 278 with the drain of transistor 282, while the source of transistor 282 communicates with ground terminal 222. The gate of transistor 282 connects between the diodes 274, 276 and also with the source of transistor 284. The drain of transistor 282 connects to the gate of that transistor 284, while the drain of transistor 284 connects to the source of transistor 272 and the gate of transistor 268.

As will be further described, the voltage level at node K determines the trigger point of the Schmitt trigger. That is, with transistor 284 off and voltage at node K two diode drops 274, 276 above ground, this corresponds to the high trigger point of the Schmitt trigger, while with transistor 284 conducting, this clamps node K to approximately a single diode drop 276 above ground.

Assuming that the input signal to the gate of transistor 260 is high, node L is high, which is the gate of transistor 278. The diode 280 pulls up node M, which in turn turns on transistor 284 which pulls node K to its low state, the lower of the two reference levels.

Assuming the input signal to the gate of transistor 260 goes low, node L will go low which is the gate of transistor 278. Node M thus goes low, turning off transistor 284, which pulls node K to its high state. Considering for the moment only the Schmitt trigger, the input signal thereto is at the gate of transistor 260, while the output signal thereof is at node M.

The next three stages, i.e., the inverters 204, 206, 208, are shown in detail also in FIG. 16, and as the inverters are identical in configuration, only one will be described in detail.

As shown therein, inverter 204 includes a load device 300 connected to voltage supply terminal 262, the load device 300 being also connected to the drain of an N-channel enhancement type field effect transistor 302, the output from node M being connected to the gate of transistor 30. The inverter also includes another N-channel enhancement type filed effect transistor 304 having its source connected to a diode 306 forward biased in the direction from the terminal 262 to terminal 222. The diode 306 is connected to the drain of another N-channel enhancement type field effect I transistor 308, having its source connected to ground terminal 222. The source of the transistor 302 is connected to the gate of the transistor 308.

The signal provided from node M is inverted by the inverter 204 and provided at node N, to be input to the next inverter 206 and the next inverter 208. As described above, the output signal of the inverter 208 is provided through a resistor 212 to the input terminal 214 connected to the gate of transistor 260, that also being connected to one terminal 216 of a capacitor 218 while the other terminal 220 of the capacitor 218 is connected to ground terminal 222. The output terminal 210 of the inverter 208 is also connected to ground terminal 222 through diodes 310, 312, 314, forward biased in the direction from terminal 262 to terminal 222. The inverter 230 takes the same form as that shown in FIG. 18, as does the inverter 238. The capacitors of those building blocks are connected to the output circuitry as previously described, and as shown also in FIG. 21.

The signal from the node P will be provided to the node R in a delayed manner because of the RC circuit defined by the resistor 212 and the capacitor 218.

The signal at node S is a square wave output whose high level is near the voltage supply level and whose low level is near a diode drop above ground. That will be translated through the capacitor 234 to node T whose high level can go no higher than a diode drop above ground because of diode 228. With node S high, node T cannot be higher than one diode drop above ground, approximately 0.7 volts, so that in this case assuming $V_{CC}$ of +5 volts, approximately 4 volts will be developed across the capacitor 234. Then when node S is driven low to 0.7 volts, down to the pedestal level (node W), node T will be pushed by the capacitor 234 below ground to approximately −3 volts. Diode 226 is thereby biased to allow node U to be driven down to a negative voltage. Since the two signals coming from the inverters 230, 238 are substantially 180° out of phase, node V at the same time is up to approximately 5 volts. Thus, although 4 volts were initially developed across capacitor 234, once the cycle has been run a few times, a greater voltage across capacitor 242 can be achieved, because, for example, the charge from capacitor 234 has been provided to the terminal 244 of capacitor 242 at the same time as the terminal 240 of the capacitor 242 is brought to the level of approximately $V_{CC}$. Because of the diode drop of diode 224, output at terminal 201 can actually reach close to −6.4 volts. thus, the presently described charge pump circuit is capable of providing a chosen level of negative voltage generated onchip through the use of low levels of power.

The timing diagram of the Schmitt trigger 202 is shown in FIG. 22. The Schmitt trigger 202 has a first, higher trip voltage which, when reached by the input signal to the Schmitt trigger 202, causes the output of the Schmitt trigger 202 to change from its previously low state, and a low trip voltage which when reached by the input signal to the Schmitt trigger 202 which causes the output of the Schmitt trigger 202 to go low. The voltage in the direction from the second trip voltage to the first trip voltage is actually being driven toward a first target voltage higher than the first trip voltage. Likewise, the voltage in the direction from the first trip voltages to the second trip voltage is actually being driven toward a second target voltage lower than the second trip voltage. The present circuit provides that the difference between the first trip voltage and first target voltage is substantially directly proportional to the difference between the second trip voltage and the second target voltage. This provides for a constant duty cycle of the oscillator portion 221 of the circuit. In fact, the difference between the first trip voltage and first target voltage is substantially equal to the difference between the second trip voltage and second target voltage, resulting in a constant 50% duty cycle, that is, where the time between any pair of adjacent rising and falling edges of the signal is substantially he same.

Furthermore, the difference between the first trip voltage and first target voltage is substantially directly proportional to the difference between the first and second trip voltages, and the difference between second trip voltage and second target voltage is substantially directly proportional to the difference between the first and second trip voltages. This results in a constant frequency, stable duty cycle. Also, the difference between the first trip voltage and first target voltage is substantially directly proportional to the difference between the second trip voltage and second target voltage. All of these relationships are established, resulting in substantially stable oscillation frequencies, over relatively large variations in supply voltage to the circuit, process variations in fabricating the circuit, and variations in temperature.

The circuit is with advantage contained in a single integrated form.

The circuits described herein have been shown as implemented in field effect transistor technology. However, it will be understood by one skilled in the art that portions or all of such circuits may be implemented in bipolar technology as well. In such case, one collector/emitter may be considered the first current handling terminal, with the other collector/emitter considered the second current handling terminal, while the base is considered the control terminal.

We claim:

1. A logic circuit having an input signal lead for receiving an input signal, an output signal lead for providing an output signal, a first voltage supply terminal, and a second voltage supply terminal, comprising:

first, second and third transistors;
said first transistor having a first current handling terminal, a control terminal, and a second current handling terminal;
load means connected between the first voltage supply terminal and the first current handling terminal of the first transistor;
said second transistor having a first current handling terminal connected to said first voltage supply terminal, a control terminal connected to the first current handling terminal of the first transistor, and a second current handling terminal;
said third transistor having a first current handling terminal connected to the second current handling terminal of the second transistor, a control terminal, and a second current handling terminal;
the control terminals of the first and third transistors being connected to the input signal lead;
the output signal lead being connected to the first current handling terminal of the third transistor; and
a load device connected between the respective current handling terminals of the first and third transistor and the second voltage supply terminal.

2. The structure as in claim 1, wherein the second voltage supply terminal is a ground voltage supply terminal.

3. The structure as in claim 1, wherein the load device is a diode forward biased in the direction from the first voltage supply terminal to the second voltage supply terminal.

* * * * *

UNITED STATES PATENT AND TRADEMARK OFFICE
CERTIFICATE OF CORRECTION

PATENT NO.   :   4,912,745

DATED        :   March 27, 1990

INVENTOR(S)  :   Mark E. Fitzpatrick and Andrew C. Graham

Page 1 of 2

It is certified that error appears in the above-identified patent and that said Letters Patent is hereby corrected as shown below:

ON TITLE PAGE:
   Related patent - now U.S. Patent No. 4,812,683 issued March 14, 1989

ON THE TITLE PAGE: Item ]73], the assignee's address should be "Sunnyvale" instead of --Santa Clara--

Col. 1 line 5-6 - insert --now U.S. patent No. 4,812,683 issued March 14, 1989--
Col. 2 line 5 - "he" should read --the--
Col. 2 line 25 - "s)is" should read --s) is--
Col. 3 line 24 - "his" should read --this--
Col. 3 line 48 - "i" should read --is--
Col. 4 line 19 - "SUMMARY" should be on a line by itself
Col. 5 line 23 - "2" should read --42--
Col. 6 line 53 - "Tis" should read --This--

UNITED STATES PATENT AND TRADEMARK OFFICE
CERTIFICATE OF CORRECTION

PATENT NO. : 4,912,745

DATED : March 27, 1990

INVENTOR(S) : Mark E. Fitzpatrick and Andrew C. Graham

It is certified that error appears in the above-identified patent and that said Letters Patent is hereby corrected as shown below:

```
Col. 7  line 62 - "stags" should read --stages--
Col. 8  line 7  - "deice" should read --device--
Col. 8  line 49 - "006" should read --106--
Col. 9  line 67 - "t" should read --to--
Col. 11 line 51 - "Tee" should read --The--
Col. 11 line 55 - "o" should read --to--
Col. 12 line 30 - "30" should read --302--
Col. 12 line 35 - delete "I"
Col. 13 line 18 - "onchip" should read --on-chip--
Col. 13 line 45 - "he" should read --the--
```

Signed and Sealed this

Thirty-first Day of March, 1992

Attest:

HARRY F. MANBECK, JR.

Attesting Officer

Commissioner of Patents and Trademarks